US012586627B2

(12) United States Patent
Wigton et al.

(10) Patent No.: US 12,586,627 B2
(45) Date of Patent: Mar. 24, 2026

(54) REFRESH PERFORMANCE OPTIMIZATIONS FOR DRAM TECHNOLOGIES WITH SUB-CHANNEL AND/OR PSEUDO-CHANNEL CONFIGURATIONS

(71) Applicant: Intel Corporation, Santa Clara, CA (US)

(72) Inventors: Michelle Wigton, Timnath, CO (US); Rawan Abdel Khalek, San Francisco, CA (US); Hussein AlAmeer, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 821 days.

(21) Appl. No.: 17/729,433

(22) Filed: Apr. 26, 2022

(65) Prior Publication Data

US 2022/0254408 A1     Aug. 11, 2022

(51) Int. Cl.
*G11C 11/40*          (2006.01)
*G11C 11/406*         (2006.01)
*G11C 11/4093*        (2006.01)
*G11C 11/4096*        (2006.01)

(52) U.S. Cl.
CPC .. *G11C 11/40615* (2013.01); *G11C 11/40622* (2013.01); *G11C 11/4093* (2013.01); *G11C 11/4096* (2013.01)

(58) Field of Classification Search
CPC ........ G11C 11/40615; G11C 11/40622; G11C 11/40; G11C 11/4093
See application file for complete search history.

(56) References Cited

U.S. PATENT DOCUMENTS

| | | | | |
|---|---|---|---|---|
| 10,061,541 | B1 * | 8/2018 | Lee ................... | G11C 11/40611 |
| 10,410,730 | B1 * | 9/2019 | Boenapalli ............. | G11C 29/52 |
| 10,770,129 | B2 | 9/2020 | Alameer et al. | |
| 2012/0263003 | A1 * | 10/2012 | Sakakibara ....... | G11C 11/40618 |
| | | | | 365/222 |
| 2021/0216238 | A1 | 7/2021 | Nale et al. | |
| 2022/0137843 | A1 * | 5/2022 | Vogelsang ............ | G06F 3/0634 |
| | | | | 711/106 |

\* cited by examiner

*Primary Examiner* — Han Yang
(74) *Attorney, Agent, or Firm* — Compass IP Law PC

(57) ABSTRACT

Systems, apparatuses and methods may provide for technology that generates a first refresh request with respect to a first sub-channel in a dynamic random access memory (DRAM), generates a second refresh request with respect to a second sub-channel in the DRAM, wherein the first sub-channel and the second sub-channel share a channel boundary, and synchronizes the first refresh request with the second refresh request. In one example, the first sub-channel is associated with a first scheduling queue and the second sub-channel is associated with a second scheduling queue. The technology may also adaptively spread refresh commands over the refresh interval period, dynamically schedule refreshes based on bus efficiency and/or selectively issue opportunistic refreshes based on read/write traffic.

17 Claims, 5 Drawing Sheets

60

70

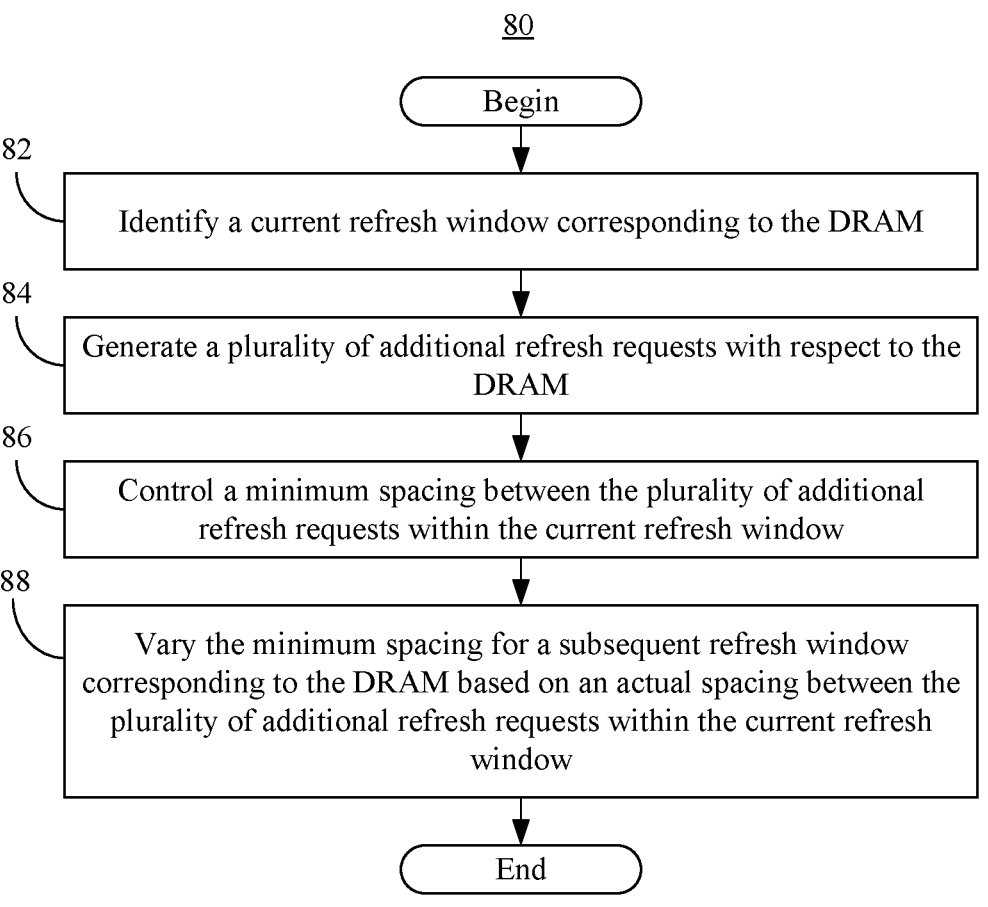

80

Begin

82

Identify a current refresh window corresponding to the DRAM

84

Generate a plurality of additional refresh requests with respect to the DRAM

86

Control a minimum spacing between the plurality of additional refresh requests within the current refresh window

88

Vary the minimum spacing for a subsequent refresh window corresponding to the DRAM based on an actual spacing between the plurality of additional refresh requests within the current refresh window End

| Logic | 147 |
|---|---|
| Substrate(s) | 145 |

REFRESH PERFORMANCE OPTIMIZATIONS FOR DRAM TECHNOLOGIES WITH SUB-CHANNEL AND/OR PSEUDO-CHANNEL CONFIGURATIONS

TECHNICAL FIELD

Embodiments generally relate to memory structures. More particularly, embodiments relate to refresh performance optimizations for dynamic random access memory (DRAM) technologies with sub-channel and/or pseudo-channel configurations.

BACKGROUND

In DRAM, data is typically held in capacitors, which leak charge over time. Conventional DRAM architectures periodically refresh the capacitors to prevent charge leakage. As part of the refresh sequence, all traffic to the portions (e.g., banks, ranks) of the DRAM being refreshed is blocked. Recent developments in DRAM technologies have led to more frequent refreshes and longer traffic blocking periods, which in turn may have a more negative impact on performance.

BRIEF DESCRIPTION OF THE DRAWINGS

The various advantages of the embodiments will become apparent to one skilled in the art by reading the following specification and appended claims, and by referencing the following drawings, in which:

FIG. 5 is a flowchart of an example of a method of distributing refresh requests across a refresh window according to an embodiment;

DESCRIPTION OF EMBODIMENTS

Figure 1:
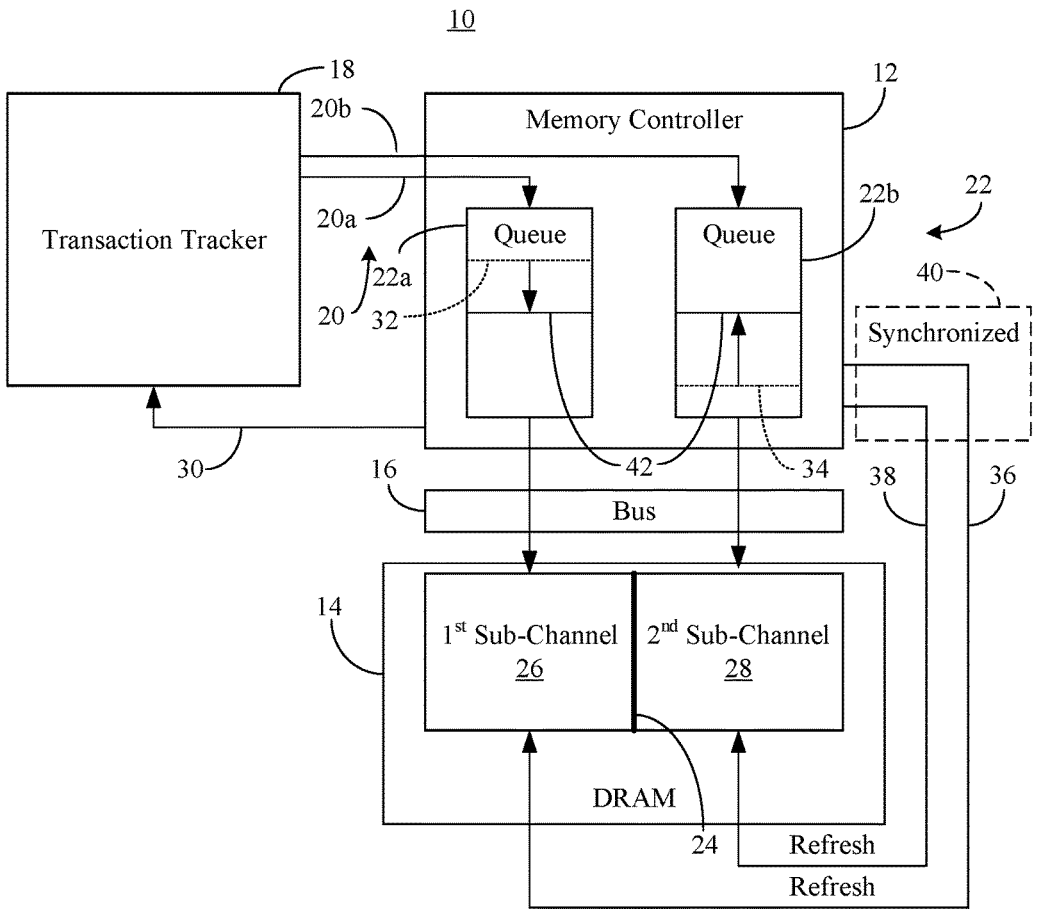
FIG. 1 is a block diagram of an example of a dynamic random access memory (DRAM) architecture having a sub-channel configuration according to an embodiment.

FIG. 1 shows a memory architecture 10 in which a memory controller 12 (e.g., integrated memory controller/WIC) communicates with a DRAM 14 (e.g., Double Date Rate 5 Synchronous Dynamic Random Access Memory/DDR5 SDRAM) over a bus 16 (e.g., data bus). The DRAM 14 might be, for example, a 64-bit DIMM (Dual Inline Memory Module) that is logically segmented into two 32-bit parts such as a first sub-channel 26 (e.g., pseudo-channel) and a second sub-channel 28. In the illustrated example, a transaction tracker 18 pushes commands 20 (20a, 20b) to scheduling queues 22 (22a, 22b) in the memory controller 12, wherein the scheduling queues 22 are divided along a channel boundary 24 that is shared by the first sub-channel 26 and the second sub-channel 28.

When refreshes are performed on, for example, the first sub-channel 26, traffic may be blocked for only the first scheduling queue 22a. Accordingly, the first scheduling queue 22a, then starts to fill, and the queues 22 may become imbalanced under conventional solutions. Additionally, the memory controller 12 may report availability information 30 associated with the scheduling queues 22, wherein the availability information 30 is determined on a "worst case" basis. For example, if the first scheduling queue 22a is at a nearly full level 32 and a second scheduling queue 22b is at a nearly empty level 34, the availability information 30 may indicate that both scheduling queues 22 are at the nearly full level 32. As a result, the transaction tracker 18 may issue fewer of the commands 20 to the memory controller 12 than the scheduling queues 22 can handle. Thus, the imbalance between the scheduling queues 22 might negatively affect performance.

Indeed, since the worst-case queue availability worsens while refresh is running, bandwidth (BW) also decreases because the second sub-channel 28 (e.g., the unblocked sub/pseudo-channel) could take more commands, but a growing number of commands 20a in the first sub-channel 26 prohibits the second sub-channel 28 from receiving any new commands 20b. Fewer commands 20 in a sub/pseudo-channel partition leads to a drop in BW efficiency because the memory controller 12 does not have sufficient commands 20 to select from and therefore is prevented from keeping the data bus 16 maximally occupied.

Synchronization of Refreshes

As will be discussed in greater detail, the illustrated memory controller 12 generates a first refresh request 36 with respect to the first sub-channel 26 and generates a second refresh request 38 with respect to the second sub-channel 28. The memory controller 12 is also enhanced to conduct a synchronization 40 between the first refresh request 36 and the second refresh request 38 across the channel boundary 24 by issuing the refresh requests 36, 38 to the DRAM 14 concurrently (e.g., rather than sequentially across sub-channels, logical ranks and bank sets, and spaced apart by a configurable setting as in conventional solutions). This approach enables the scheduling queues 22 to fill according to traffic patterns and not be hampered by the accumulation of transactions in a specific partition of the DRAM 14. For example, the illustrated synchronization 40 results in both the first synchronization queue 22a and the second synchronization queue 22b filling to a common level 42. The result is a substantial improvement in bandwidth for memory configurations that are affected by the worst-case scenario.

Spreading Refresh Commands Over the Refresh Interval Period

In general, the frequency of refresh commands is specified by a refresh interval timing parameter (e.g., "tREFI" period). As part of the refresh sequence, all traffic to the rank or bank that is being refreshed is blocked by a scheduler during the refresh operation, where the blocking time is specified by a blocking timing parameter (e.g., "tRFC"). Accordingly, refresh has a measurable impact on memory performance causing bandwidth degradation and latency increase. With an increasing density of the DRAM 14, the blocking time tRFC increases (e.g., as with DDR5 technology). In addition, DDR5 introduces fine-grain refresh where tREFI is ¼th that of DDR4 (e.g., Double Date Rate 4 SDRAM) and same-bank refresh, where each refresh operation is divided across bank sets (e.g., a single bank in every bank group).

Figure 2:
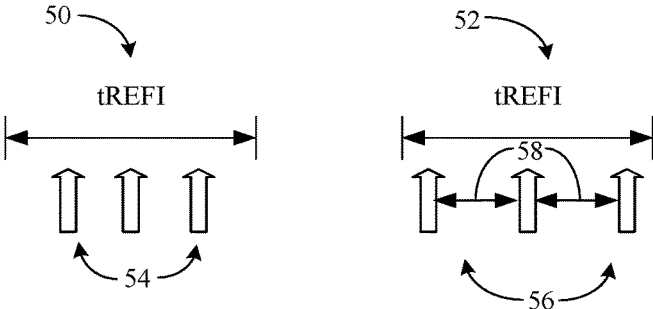
FIG. 2 is a comparative illustration of an example of a conventional refresh distribution and an enhanced refresh distribution according to an embodiment.
Figure 3:
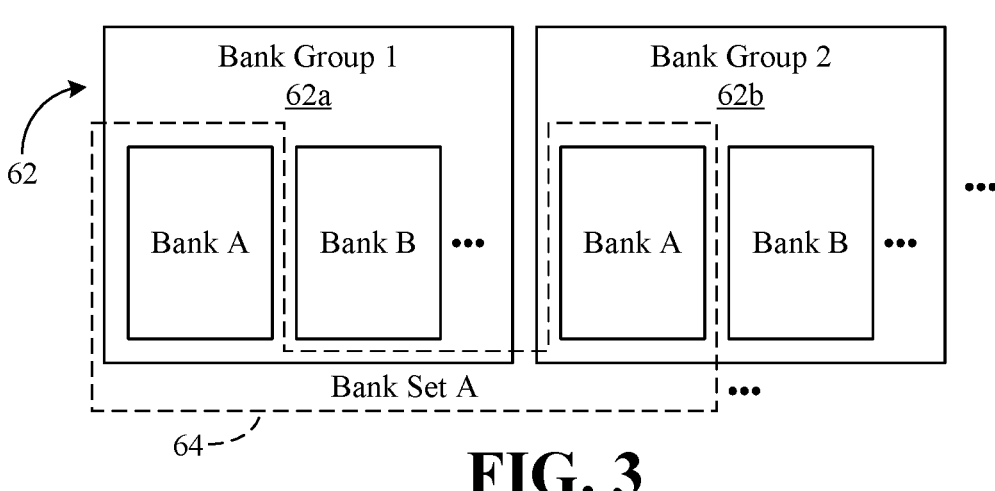
FIG. 3 is a block diagram of an example of DRAM architecture according to an embodiment.

Turning now to FIGS. 2 and 3, a conventional refresh window (tREFI) 50 and an enhanced refresh window 52 are shown for a DRAM architecture 60 that is organized into a plurality of bank groups 62 (62a, 62b) and bank sets 64. As already noted, the contents of the DRAM architecture 60 may be refreshed every refresh interval period (e.g., tREFI), with a bounded allowance in how many refreshes can be delayed. Also, depending on the type of refresh (e.g., same bank versus all bank) and memory (e.g., three-dimensional stacking/3DS versus non-3DS DIMMs), there could be many commands to be sent when the periodic refresh function is performed. In the conventional refresh window 50, refresh requests 54 are issued without regard to the spacing between the refresh requests 54. By contrast, the enhanced refresh window 52 includes a minimum spacing 58 that is controlled between refresh requests 56. Thus, the refresh requests 56 are sent as far apart as possible from one another, while still completing in the enhanced refresh window 52. As a result, an improvement in bandwidth performance is achieved because "pent-up" traffic can be issued during the minimum spacing 58 (e.g., in the "gaps").
Adaptive Refresh Hardware There may be an inherent variability in the timing of when the refresh requests 56 can be issued during the enhanced refresh window 52 on the bus due to other traffic. Embodiments therefore improve BW performance by using a hardware solution to adaptively insert the minimum spacing 58 between sequential refreshes, based on a targeted and measured/actual spacing 58 over the previous refresh window. The result is more consistent spacing 58 (e.g., more uniform refreshes) over the enhanced refresh window 52 and a performance benefit. More particularly, the BW gain observed is a result of 1) better utilization of queues due to the synchronization of refreshes across the sub/pseudo channels, and 2) reducing the number of banks blocked by refresh at any moment due to a more uniform spacing 58 of refreshes within a sub/pseudo-channel. As a result, the memory controller has a larger set of commands to select from to maximize data bus efficiency.
Dynamic Scheduling of Refreshes Based on Bus Efficiency In an embodiment, refreshes are also opportunistically issued, independent of active traffic, based on the measured bus efficiency over a configurable window of time. If the measured bandwidth is below a configurable threshold (e.g., bandwidth threshold), refreshes can be issued to capitalize on the available bandwidth.
Selective Issuance of Opportunistic Refreshes Based on Read/Write Traffic In cases where workloads are read latency sensitive, read performance may be prioritized over write performance because there is a process upstream that is waiting for the read results to return. Based on a configurable outstanding writes threshold (e.g., sensitivity threshold), some refreshes can be opportunistically issued during write phases of scheduling. This approach leads to fewer refresh requirements when scheduling read operations ("reads") and reduces the impact of refreshes on read performance.

Conversely, in bandwidth heavy workloads that are not latency sensitive, higher overall bandwidth can be achieved by selectively issuing refreshes during a read phase instead of a write phase. This dynamic is due to write operations ("writes") requiring higher bank level parallelism than reads to saturate the data bus. A refresh typically takes many banks offline for a long duration of time (tRFC) resulting in lower peak bandwidth if the refresh coincides during a write phase.

Based on configurable outstanding read and write thresholds, some refreshes can be opportunistically issued during read phases of scheduling. The result is writes having higher bank level parallelism when scheduling writes and a boost in overall bandwidth for the combined read and write phases.

Figure 4:
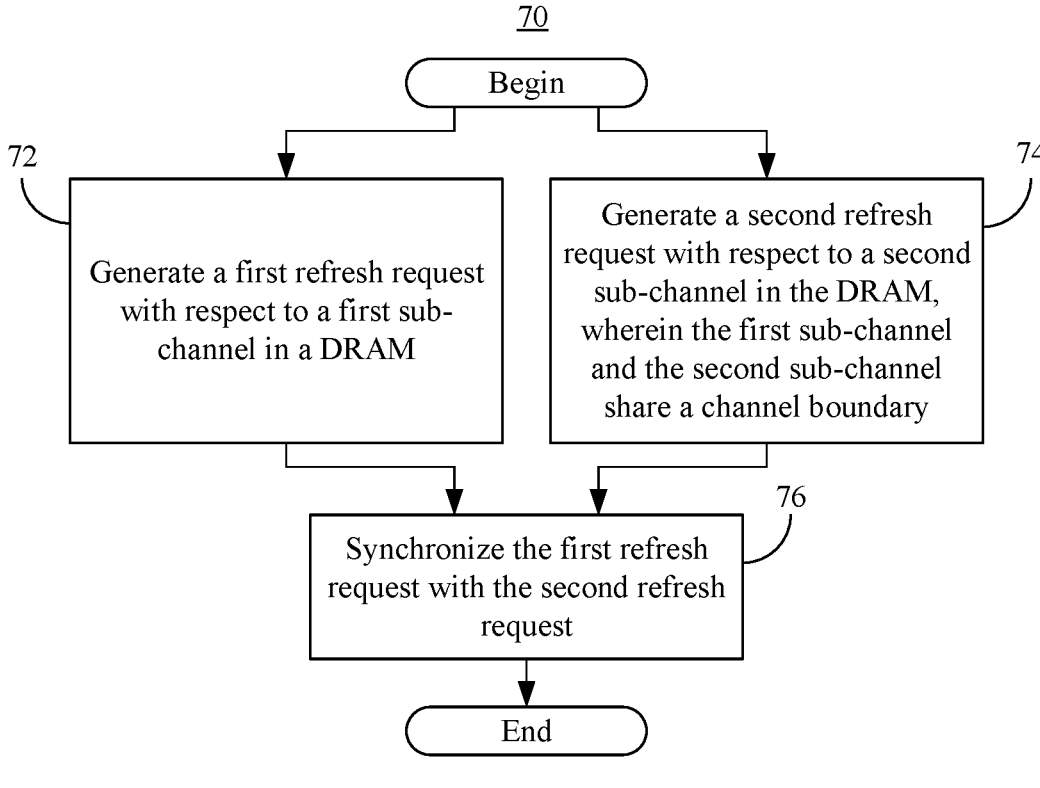
FIG. 4 is a flowchart of an example of a method of synchronizing refresh requests according to an embodiment.

FIG. 4 shows a method 70 of synchronizing refresh requests. The method 70 may generally be implemented in an architecture such as, for example, the memory architecture 10 (FIG. 1) and/or the DRAM architecture 60 (FIG. 3), already discussed. More particularly, the method 70 may be implemented in one or more modules as a set of logic instructions stored in a machine- or computer-readable storage medium such as random access memory (RAM), read only memory (ROM), programmable ROM (PROM), firmware, flash memory, etc., in hardware, or any combination thereof. For example, hardware implementations may include configurable logic, fixed-functionality logic, or any combination thereof. Examples of configurable logic include suitably configured programmable logic arrays (PLAs), field programmable gate arrays (FPGAs), complex programmable logic devices (CPLDs), and general purpose microprocessors. Examples of fixed-functionality logic include suitably configured application specific integrated circuits (ASICs), combinational logic circuits, and sequential logic circuits. The configurable or fixed-functionality logic can be implemented with complementary metal oxide semiconductor (CMOS) logic circuits, transistor-transistor logic (TTL) logic circuits, or other circuits.

Illustrated processing block 72 provides for generating a first refresh request with respect to a first sub-channel in a DRAM and block 74 provides for generating a second refresh request with respect to a second sub-channel in the DRAM, wherein the first sub-channel and the second sub-channel share a channel boundary. Block 76 synchronizes the first refresh request with the second refresh request. In an embodiment, block 76 includes concurrently issuing the first refresh request and the second refresh request to the DRAM. Additionally, the first sub-channel may be associated with a first scheduling queue and the second sub-channel may be associated with a second scheduling queue. In one example, block 76 includes using a hardware register to control the synchronization of refresh same bank (e.g., REFsb) sequences across the channel boundary and to control when each REFsb sequence starts within the current refresh window (e.g., staggering across physical ranks). Block 76 may also include using a hardware register to control the synchronization of refresh all bank (e.g., REFab) sequences across the channel boundary and to control when each REFab sequence starts within the current refresh window (e.g., staggering across physical ranks). In an embodiment, the hardware registers are programmed by BIOS (Basic Input/Output System) and exposed as CPU (central processing unit) configuration knobs in boot time options.

The method 70 therefore enhances performance at least to the extent that synchronizing the first refresh request with the second refresh request enables the scheduling queues to fill according to traffic patterns and not be hampered by the accumulation of transactions in a specific partition of the DRAM. The result is a substantial improvement in bandwidth for memory configurations that are affected by the worst-case scenario.

FIG. 5 shows a method 80 of distributing refresh requests across a refresh window. The method 80 may generally be implemented in an architecture such as, for example, the memory architecture 10 (FIG. 1) and/or the DRAM architecture 60 (FIG. 3), already discussed, and in conjunction with the method 70 (FIG. 4), already discussed. More particularly, the method 70 may be implemented in one or more modules as a set of logic instructions stored in a machine- or computer-readable storage medium such as RAM, ROM, PROM, firmware, flash memory, etc., in hardware, or any combination thereof.

Illustrated processing block 82 provides for identifying a current refresh window corresponding to the DRAM. In an embodiment, block 82 involves reading a refresh interval timing parameter (e.g., tREFI) from a hardware register. Block 84 generates a plurality of additional refresh requests with respect to the DRAM, wherein block 86 controls a minimum spacing between the plurality of additional refresh requests within the current refresh window. In one example, block 86 uses a hardware register to set a target spacing between neighboring refresh same bank (e.g., REFsb) commands within a physical rank for 3DS or non-3DS DIMMS. Block 86 may also use a hardware register to set a target spacing between neighboring refresh all bank (e.g., REFab) commands within a physical rank. Additionally, block 88 may vary the minimum spacing for a subsequent refresh window corresponding to the DRAM based on an actual spacing between the plurality of additional refresh requests within the current refresh window.

The method 80 therefore further enhances performance at least to the extent that spreading refresh commands over the refresh interval period increases bandwidth performance because pent-up traffic can be issued during the minimum spacing (e.g., in the gaps). The method 80 also enhances performance to the extent that varying the minimum spacing for the subsequent refresh window based on the actual spacing within the current refresh window enables better utilization of queues due to the synchronization of refreshes across the sub/pseudo channels, reduces the number of banks blocked by refresh at any moment due to a more uniform spacing of refreshes within a sub/pseudo-channel and/or provides the memory controller with a larger set of commands to select from to maximize data bus efficiency.

Figure 6:
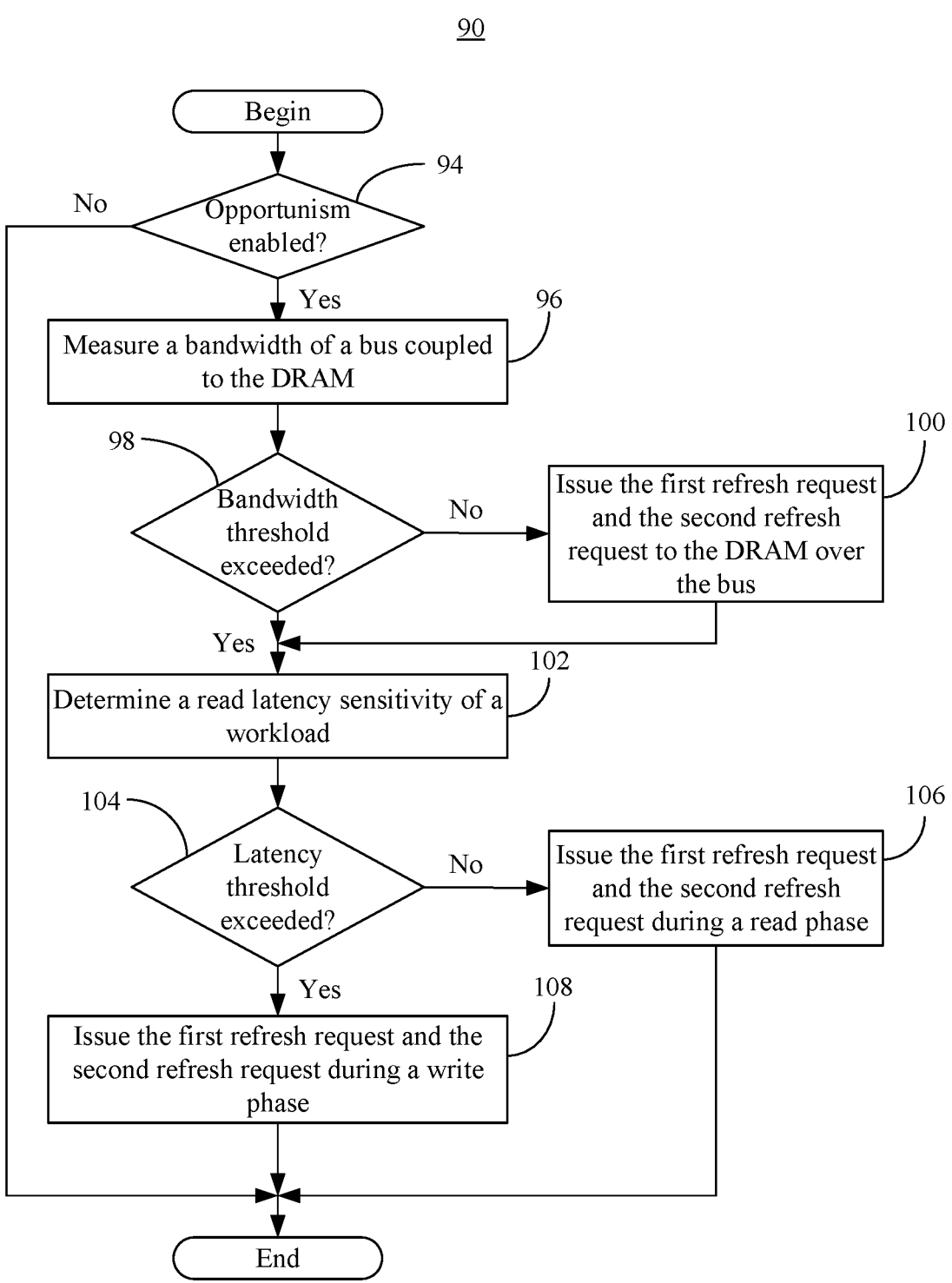
FIG. 6 is a flowchart of an example of a method of opportunistically issuing refresh requests according to an embodiment.

FIG. 6 shows a method 90 of opportunistically issuing refresh requests. The method 90 may generally be implemented in an architecture such as, for example, the memory architecture 10 (FIG. 1) and/or the DRAM architecture 60 (FIG. 3), already discussed, and in conjunction with the method 70 (FIG. 4) and/or the method 80 (FIG. 5), already discussed. More particularly, the method 90 may be implemented in one or more modules as a set of logic instructions stored in a machine- or computer-readable storage medium such as RAM, ROM, PROM, firmware, flash memory, etc., in hardware, or any combination thereof.

Illustrated processing block 94 determines whether opportunism is enabled for the DRAM. If not, the method 90 terminates. Otherwise, block 96 measures a bandwidth of a bus (e.g., data bus) coupled to the DRAM. In an embodiment, block 98 determines whether the measured bandwidth exceeds a bandwidth threshold (e.g., dynamic scheduling of refreshes based on bus efficiency). If not, block 100 issues the first refresh request and the second refresh request to the DRAM over the bus. Otherwise, the method bypasses block 100 and block 102 determines a read latency sensitivity of a workload supported by the DRAM. Block 102 might determine, for example, whether or how many upstream processes are waiting for the read results to return. In one example, block 104 determines whether the read latency sensitivity exceeds a latency threshold (e.g., one or more upstream processes, providing selective issuance of opportunistic refreshes based on read/write traffic). If not, block 106 issues the first refresh request and the second refresh request during a read phase. Otherwise, block 108 issues the first refresh request and the second refresh request during a write phase.

Thus, the method 90 further enhances performance at least to the extent that dynamic scheduling of refreshes based on bus efficiency enables the issuance of refreshes to capitalize on available bandwidth. The method 90 may also enhance performance to the extent that selectively issuing opportunistic refreshes based on read/write traffic leads to fewer refresh requirements when scheduling read operations ("reads") and/or reduces the impact of refreshes on read performance. Indeed, the method 90 may further enhance performance to the extent that selectively issuing opportunistic refreshes based on read/write traffic enables writes to have higher bank level parallelism when scheduling writes and/or boosts overall bandwidth for the combined read and write phases. Moreover, unlike conventional solutions, blocks 100, 106 and 108 provide for scheduling optimistic refresh requests while traffic to the target rank or bank is not idle.

Figures 7, 8:
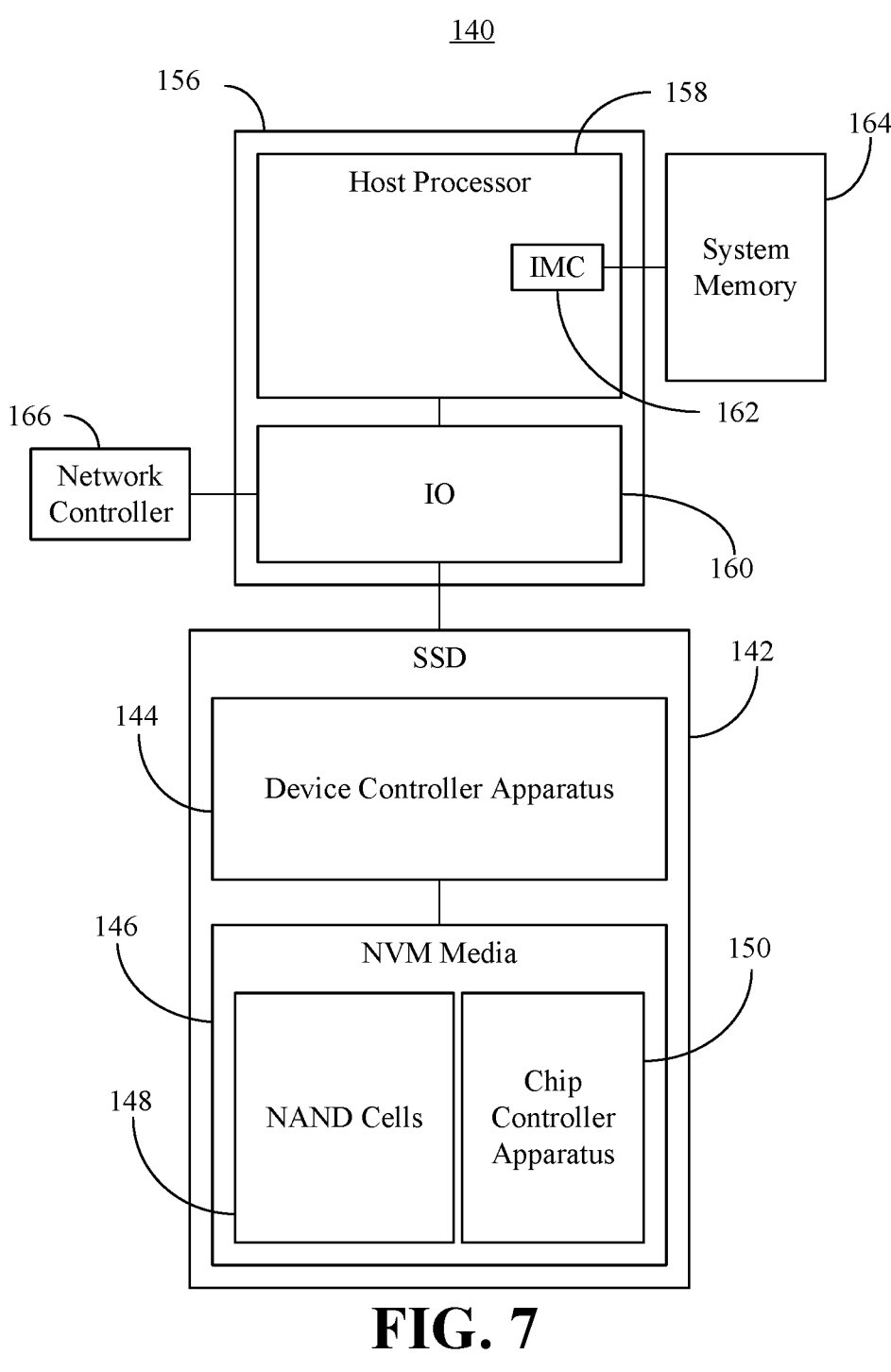
FIG. 7 is a block diagram of an example of a performance-enhanced computing system according to an embodiment.
FIG. 8 is an illustration of an example of a semiconductor package according to an embodiment.

FIG. 7 shows a performance-enhanced computing system 140. The system 140 may be part of a server, desktop computer, notebook computer, tablet computer, convertible tablet, smart television (TV), personal digital assistant (PDA), mobile Internet device (MID), smart phone, wearable device, media player, vehicle, robot, Internet of Things (IoT) device, drone, autonomous vehicle, etc., or any combination thereof. In the illustrated example, an input/output (IO) module 160 is communicatively coupled to a solid state drive (SSD) 142 and a network controller 166 (e.g., wired, wireless).

The system 140 may also include a host processor 158 (e.g., central processing unit/CPU) that includes an integrated memory controller (IMC) 162, wherein the illustrated WIC 162 communicates with a system memory 164 (e.g., DRAM) over a bus or other suitable communication interface. The host processor 158 and the IO module 160 are integrated onto a shared semiconductor die 156 in a system on chip (SoC) architecture.

In an embodiment, the IMC 162 includes logic (e.g., configurable hardware, fixed-functionality hardware, etc., or any combination thereof) to implement one or more aspects of the method 70 (FIG. 4), the method 80 (FIG. 5) and/or the method 90 (FIG. 6), already discussed. Thus, the logic may generate a first refresh request with respect to a first sub-channel in the system memory 164, generate a second refresh request with respect to a second sub-channel in the system memory 164, wherein the first sub-channel and the second sub-channel share a channel boundary, and synchronize the first refresh request with the second refresh request. The computing system 140 is therefore performance-enhanced at least to the extent that synchronizing the first refresh request with the second refresh request enables scheduling queues to fill according to traffic patterns and not be hampered by the accumulation of transactions in a specific partition of the system memory 164. The result is a substantial improvement in bandwidth for memory configurations that are affected by the worst-case scenario.

The SSD 142 may include a device controller apparatus 144 coupled to non-volatile memory (NVM) media 146. In an embodiment, the NVM media 146 includes a chip controller apparatus 150 coupled to a plurality of NAND cells 148.

FIG. 8 shows a semiconductor apparatus 143 (e.g., chip, die) that includes one or more substrates 145 (e.g., silicon, sapphire, gallium arsenide) and logic 147 (e.g., transistor array and other integrated circuit/IC components) coupled to the substrate(s) 145. The logic 147, which may be implemented at least partly in configurable and/or fixed-functionality hardware, may generally implement one or more aspects of the method 70 (FIG. 4), the method 80 (FIG. 5) and/or the method 90 (FIG. 6), already discussed. Thus, the logic 147 may generate a first refresh request with respect to a first sub-channel in a DRAM, generate a second refresh request with respect to a second sub-channel in the DRAM, wherein the first sub-channel and the second sub-channel share a channel boundary, and synchronize the first refresh request with the second refresh request (e.g., across the channel boundary).

In one example, the logic 147 includes transistor channel regions that are positioned (e.g., embedded) within the substrate(s) 145. Thus, the interface between the logic 14 and the substrate(s) 145 may not be an abrupt junction. The logic 147 may also be considered to include an epitaxial layer that is grown on an initial wafer of the substrate(s) 145.

ADDITIONAL NOTES AND EXAMPLES

Example 1 includes a semiconductor apparatus comprising one or more substrates and logic coupled to the one or more substrates, wherein the logic is implemented at least partly in one or more of configurable or fixed-functionality hardware, the logic to generate a first refresh request with respect to a first sub-channel in a dynamic random access memory (DRAM), generate a second refresh request with respect to a second sub-channel in the DRAM, wherein the first sub-channel and the second sub-channel share a channel boundary, and synchronize the first refresh request with the second refresh request.

Example 2 includes the semiconductor apparatus of Example 1, wherein the first sub-channel is to be associated with a first scheduling queue and the second sub-channel is associated with a second scheduling queue.

Example 3 includes the semiconductor apparatus of Example 1, wherein the logic is further to identify a current refresh window corresponding to the DRAM, generate a plurality of additional refresh requests with respect to the DRAM, and control a minimum spacing between the plurality of additional refresh requests within the current refresh window.

Example 4 includes the semiconductor apparatus of Example 3, wherein the logic is further to vary the minimum spacing for a subsequent refresh window corresponding to the DRAM based on an actual spacing between the plurality of additional refresh requests within the current refresh window.

Example 5 includes the semiconductor apparatus of Example 1, wherein the logic is further to measure a bandwidth of a bus coupled to the DRAM, and issue the first refresh request and the second refresh request to the DRAM over the bus if the measured bandwidth does not exceed a bandwidth threshold.

Example 6 includes the semiconductor apparatus of any one of Examples 1 to 5, wherein the logic is further to determine a read latency sensitivity of a workload, and issue the first refresh request and the second refresh request during a write phase if the read latency sensitivity exceeds a sensitivity threshold.

Example 7 includes the semiconductor apparatus of Example 6, wherein the logic is further to issue the first refresh request and the second refresh request during a read phase if the read latency sensitivity does not exceed the sensitivity threshold.

Example 8 includes a performance-enhanced computing system comprising a dynamic random access memory (DRAM), and a controller coupled to the DRAM, wherein the controller includes logic implemented at least partly in one or more of configurable or fixed-functionality hardware, the logic to generate a first refresh request with respect to a first sub-channel in the DRAM, generate a second refresh request with respect to a second sub-channel in the DRAM, wherein the first sub-channel and the second sub-channel share a channel boundary, and synchronize the first refresh request with the second refresh request.

Example 9 includes the computing system of Example 8, wherein the first sub-channel is to be associated with a first scheduling queue and the second sub-channel is associated with a second scheduling queue.

Example 10 includes the computing system of Example 8, wherein the logic is further to identify a current refresh window corresponding to the DRAM, generate a plurality of additional refresh requests with respect to the DRAM, and control a minimum spacing between the plurality of additional refresh requests within the current refresh window.

Example 11 includes the computing system of Example 10, wherein the logic is further to vary the minimum spacing for a subsequent refresh window corresponding to the DRAM based on an actual spacing between the plurality of additional refresh requests within the current refresh window.

Example 12 includes the computing system of Example 8, wherein the logic is further to measure a bandwidth of a bus coupled to the DRAM, and issue the first refresh request and the second refresh request to the DRAM over the bus if the measured bandwidth does not exceed a bandwidth threshold.

Example 13 includes the computing system of any one of Examples 8 to 12, wherein the logic is further to determine a read latency sensitivity of a workload, and issue the first refresh request and the second refresh request during a write phase if the read latency sensitivity exceeds a sensitivity threshold.

Example 14. The computing system of Example 13, wherein the logic is further to issue the first refresh request and the second refresh request during a read phase if the read latency sensitivity does not exceed the sensitivity threshold.

Example 15 includes a method of operating a controller, the method comprising generating a first refresh request with respect to a first sub-channel in a dynamic random access memory (DRAM), generating a second refresh request with respect to a second sub-channel in the DRAM, wherein the first sub-channel and the second sub-channel share a channel boundary, and synchronizing the first refresh request with the second refresh request.

Example 16 includes the method of Example 15, wherein the first sub-channel is associated with a first scheduling queue and the second sub-channel is associated with a second scheduling queue.

Example 17 includes the method of Example 15, further including identifying a current refresh window corresponding to the DRAM, generating a plurality of additional refresh requests with respect to the DRAM, and controlling a minimum spacing between the plurality of additional refresh requests within the current refresh window.

Example 18 includes the method of Example 17, further including varying the minimum spacing for a subsequent refresh window corresponding to the DRAM based on an actual spacing between the plurality of additional refresh requests within the current refresh window.

Example 19 includes the method of Example 15, further including measuring a bandwidth of a bus coupled to the DRAM, and issuing the first refresh request and the second refresh request to the DRAM over the bus if the measured bandwidth does not exceed a bandwidth threshold.

Example 20 includes the method of any one of Examples 15 to 19, further including determining a read latency sensitivity of a workload, issuing the first refresh request and the second refresh request during a write phase if the read latency sensitivity exceeds a sensitivity threshold, and issuing the one or more additional refresh requests during a read phase if the read latency sensitivity does not exceed the sensitivity threshold.

Example 21 includes an apparatus comprising means for performing the method of any one of Examples 15 to 20.

Technology described herein may therefore employ multiple techniques to maximize bandwidth efficiency. The technology uses various refresh techniques specifically aimed to optimize blocking time as DRAMs move to higher densities and new sub-channel and pseudo-channel organizations.

Embodiments are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments. Further, arrangements may be shown in block diagram form in order to avoid obscuring embodiments, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments, it should be apparent to one skilled in the art that embodiments can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc.

may be used herein only to facilitate discussion, and carry no particular temporal or chronological significance unless otherwise indicated.

As used in this application and in the claims, a list of items joined by the term "one or more of" may mean any combination of the listed terms. For example, the phrases "one or more of A, B or C" may mean A; B; C; A and B; A and C; B and C; or A, B and C.

Those skilled in the art will appreciate from the foregoing description that the broad techniques of the embodiments can be implemented in a variety of forms. Therefore, while the embodiments have been described in connection with particular examples thereof, the true scope of the embodiments should not be so limited since other modifications will become apparent to the skilled practitioner upon a study of the drawings, specification, and following claims.

We claim:

1. A semiconductor apparatus comprising:
a communication interface to couple to a dual inline memory module (DIMM) having dynamic random access memory (DRAM) devices on a memory channel, the memory channel segmented into a first pseudo-channel and a second pseudo-channel by use of a double data rate command bus; and
a first scheduling queue to queue memory access commands for the first pseudo-channel and a second scheduling queue to queue memory access commands for the second pseudo-channel;
wherein when the first scheduling queue has a first refresh request for the first pseudo-channel and the second scheduling queue has a second refresh request for the second pseudo-channel, logic is to adjust a timing of one of the refresh requests to synchronize the first refresh request with the second refresh request to cause the first pseudo-channel and the second pseudo-channel to enter refresh concurrently.

2. The semiconductor apparatus of claim 1, wherein the logic is further to:
identify a current refresh window corresponding to the DRAM devices on the DIMM;
generate a plurality of additional refresh requests with respect to the DRAM devices on the DIMM; and
control a minimum spacing between the plurality of additional refresh requests within the current refresh window.

3. The semiconductor apparatus of claim 2, wherein the logic is further to vary the minimum spacing for a subsequent refresh window based on an actual spacing between the plurality of additional refresh requests within the current refresh window.

4. The semiconductor apparatus of claim 1, wherein the logic is further to:
measure a bandwidth of a bus coupled to the DRAM devices on the DIMM; and
issue the first refresh request and the second refresh request over the bus if the measured bandwidth does not exceed a bandwidth threshold.

5. The semiconductor apparatus of claim 1, wherein the logic is further to:
determine a read latency sensitivity of a workload; and
issue the first refresh request and the second refresh request during a write phase if the read latency sensitivity exceeds a sensitivity threshold.

6. The semiconductor apparatus of claim 5, wherein the logic is further to issue the first refresh request and the second refresh request during a read phase if the read latency sensitivity does not exceed the sensitivity threshold.

7. A computing system comprising:

a dual inline memory module (DIMM) having dynamic random access memory (DRAM) devices on a memory channel, the memory channel segmented into a first pseudo-channel and a second pseudo-channel by use of a double data rate command bus; and a controller coupled to the DRAM, wherein the controller includes logic and a first scheduling queue to queue memory access commands for the first pseudo-channel and a second scheduling queue to queue memory access commands for the second pseudo-channel;

wherein when the first scheduling queue has a first refresh request for the first pseudo-channel and the second scheduling queue has a second refresh request for the second pseudo-channel, logic is to adjust a timing of one of the refresh requests to synchronize the first refresh request with the second refresh request to cause the first pseudo-channel and the second pseudo-channel to enter refresh concurrently.

8. The computing system of claim 7, wherein the logic is further to:

identify a current refresh window corresponding to the DRAM devices on the DIMM;

generate a plurality of additional refresh requests with respect to the DRAM devices on the DIMM; and control a minimum spacing between the plurality of additional refresh requests within the current refresh window.

9. The computing system of claim 8, wherein the logic is further to vary the minimum spacing for a subsequent refresh window based on an actual spacing between the plurality of additional refresh requests within the current refresh window.

10. The computing system of claim 7, wherein the logic is further to:

measure a bandwidth of a bus coupled to the DRAM devices on the DIMM; and issue the first refresh request and the second refresh request over the bus if the measured bandwidth does not exceed a bandwidth threshold.

11. The computing system of claim 7, wherein the logic is further to:

determine a read latency sensitivity of a workload; and issue the first refresh request and the second refresh request during a write phase if the read latency sensitivity exceeds a sensitivity threshold.

12. The computing system of claim 11, wherein the logic is further to issue the first refresh request and the second refresh request during a read phase if the read latency sensitivity does not exceed the sensitivity threshold.

13. A method comprising:

queuing a first refresh request in a first scheduling queue for a first pseudo-channel of a dual inline memory module (DIMM) having dynamic random access memory (DRAM) devices on a memory channel, the memory channel segmented into the first pseudo-channel and a second pseudo-channel by use of a double data rate command bus;

queuing a second refresh request a second scheduling queue for the second pseudo-channel; and adjusting a timing of one of the refresh requests to synchronize the first refresh request with the second refresh request to cause the first pseudo-channel and the second pseudo-channel to enter refresh concurrently.

14. The method of claim 13, further including:

identifying a current refresh window corresponding to the DRAM devices on the DIMM;

generating a plurality of additional refresh requests with respect to the DRAM devices on the DIMM; and controlling a minimum spacing between the plurality of additional refresh requests within the current refresh window.

15. The method of claim 14, further including varying the minimum spacing for a subsequent refresh window based on an actual spacing between the plurality of additional refresh requests within the current refresh window.

16. The method of claim 13, further including:

measuring a bandwidth of a bus coupled to the DRAM devices on the DIMM; and issuing the first refresh request and the second refresh request over the bus if the measured bandwidth does not exceed a bandwidth threshold.

17. The method of claim 13, further including:

determining a read latency sensitivity of a workload;

issuing the first refresh request and the second refresh request during a write phase if the read latency sensitivity exceeds a sensitivity threshold; and issuing the first refresh request and the second refresh request during a read phase if the read latency sensitivity does not exceed the sensitivity threshold.

* * * * *